United States Patent [19]

LaBranche et al.

[11] Patent Number: 5,518,663

[45] Date of Patent: May 21, 1996

[54] THICK FILM CONDUCTOR COMPOSITIONS WITH IMPROVED ADHESION

[75] Inventors: Marc H. LaBranche, Chapel Hill, N.C.; Bradley J. Schickling, San Juan, Puerto Rico; Barry E. Taylor, Wake Forest, N.C.

[73] Assignee: E. I. Du Pont de Nemours and Company, Wilmington, Del.

[21] Appl. No.: 350,361

[22] Filed: Dec. 6, 1994

[51] Int. Cl.⁶ .............................. H01B 1/22; H01B 1/16; C09D 5/24

[52] U.S. Cl. .......................... 252/514; 252/513; 252/519; 252/521; 252/518; 252/512

[58] Field of Search .................................. 252/514, 513, 252/519, 521, 518, 512; 501/126; 423/593, 604

[56] References Cited

U.S. PATENT DOCUMENTS

| 3,583,931 | 6/1971 | Bouchard et al. | 252/521 X |
|---|---|---|---|
| 4,302,362 | 11/1981 | Hoffman et al. | 252/521 X |
| 4,420,422 | 12/1983 | Ferretti | 252/521 X |
| 4,636,332 | 1/1987 | Craig et al. | 252/521 X |
| 4,959,330 | 9/1990 | Donohue et al. | 501/8 |
| 5,264,156 | 11/1993 | Gora et al. | 252/521 X |
| 5,344,592 | 9/1994 | Wilczek et al. | 252/514 X |

FOREIGN PATENT DOCUMENTS

| 5-128908 | 5/1993 | Japan . |
|---|---|---|
| 5-174617 | 7/1993 | Japan . |

OTHER PUBLICATIONS

*The Condensed Chemical Dictionary*, 4th ed., 1950, Turner, Francis M., ed., Reinhold Publishing Corporation, p. 288.

*Primary Examiner*—Douglas J. McGinty

[57] ABSTRACT

The invention is directed to a thick film conductor composition wherein such compositions have improved solderability and adhesion to substrates due to the addition of a crystalline material from the feldspar family.

9 Claims, No Drawings

THICK FILM CONDUCTOR COMPOSITIONS WITH IMPROVED ADHESION

FIELD OF THE INVENTION

The invention relates to thick film conductor compositions and, in particular, relates to such compositions having improved solderability and adhesion to the substrates on which they are employed.

BACKGROUND OF THE INVENTION

The use of thick film conductors in hybrid microelectronic components is well known in the electronics field. Such materials are usually comprised of a dispersion of finely divided particles of a noble metal, noble metal alloy or mixtures thereof and inorganic binder, both dispersed in an organic medium to form a pastelike product. The consistency and rheology of the paste is adjusted to the particular method of application such as screen printing, brushing, dipping, extrusion, spraying and the like. Such pastes are usually applied to an inert substrate such as alumina by screen printing to form a patterned layer. The patterned thick film conductor layer is then fired to volatilize (e.g., "burn off") the organic medium and sinter both the inorganic binder, which is typically a glass or a glass-forming material, and the finely divided particles of noble metals, noble metal alloys or mixtures thereof. Firing temperatures for such pastes are usually about 600°–900° C.

In addition to the electrical conductivity properties which the fired conductive layer possesses, the fired layer needs to adhere firmly to the substrate on which it is printed and that layer needs to be capable of accepting solder. Solderability is a very desirable property because of the necessity of connecting the conductive pattern with other components of the electronic system in which it is to be used, e.g., resistor and capacitor networks, resistors, trim potentiometers, chip resistors, chip capacitors, chip carriers and the like.

Customer needs and expectations continually increase for commercial thick film pastes. The requirements of high adhesion and high solderability become increasingly difficult to simultaneously meet. The inorganic binder phase that is included in a thick film conductor composition for the purpose of adhesion can interfere with solder wetting. Thus, techniques and compositions that can raise soldered adhesion while minimizing degradation to conductor solderability are particularly valuable.

SUMMARY OF THE INVENTION

The invention is, therefore, directed to a thick film composition comprising by weight, basis paste: (A) 50 to 90% wt. of finely divided particles of metallic conductive phase, (B) 1 to 18% wt. of an inorganic binder phase, (C) 0.01 to 3.0% wt. adhesion promoter of the formula $[M_a^{1+}]_x[M_b^{2+}]_{1-x}Al_{2-x}Si_{230\ x}O_8$, wherein $M_a$ is selected from the group K, Na, and $M_b$ is Ca, and x is 0–1, and all of (A), (B) and (C) dispersed in an organic medium.

DETAILED DESCRIPTION OF THE INVENTION

The composition of the invention consists of finely divided particles of conductive metals, alloys or mixtures thereof, an inorganic binder and an adhesion promoter, all dispersed in a medium. The term "finely divided" will be understood by those skilled in the "thick film" art to mean particles sufficiently fine to pass through a 400-mesh screen (US standard sieve scale). It is preferred that substantially all of the particles are in the size range of 0.01–20 microns, with the largest dimension more preferably being no larger than 5 microns.

Conductive Phase

Any of the noble metals, their alloys or mixtures thereof may be used as the conductive phase for the composition of the invention. Thus, noble metals such as Ag, Au, Pt and Pd can be used as well as their alloys such as Pt/Au, Pd/Ag, Pd/Au, Pt/Ag, Pt/Pd/Au and Pt/Pd/Ag.

The amount of solids in the composition relative to paste is 50–95 percent by weight, and complementarily 5–50% organic medium. Preferably, the solids are 60–90% by weight, and most preferably 70–85% by weight. The amount of conductive metal in the composition relative to total solids is in the range of 60–99% wt. of the composition, excluding the organic medium. However, 75–98% wt. conductive metal and complementarily 25–5% wt. inorganic binder is preferred.

Inorganic Binder

Suitable inorganic binders are those conventional materials which upon sintering serve to bind metal to ceramic substrates, such as glasses, certain metal oxides and glass precursors. Conventional glass frits such as lead borates, lead silicates, lead borosilicates, cadmium borate, lead cadmium borosilicates, zinc borosilicates, and sodium cadmium borosilicates, bismuth silicates, bismuth borosilicates, bismuth lead silicates, and bismuth lead borosilicates can be employed, though the above list does not limit the present invention. Usually any glass having a high content of bismuth oxide is preferred. Such high bismuth glass contains at least 50% by weight bismuth oxide and preferably at least 70%. Alternately, a mixture of glass and bismuth oxide can be used in place of bismuthate glass. Additions of lead oxide as a separate phase are also common. Preferred glasses are shown in TABLE 1 below; the oxide components are given in weight percent:

TABLE 1

|  | A | B | C | D | E | F | G | H |
|---|---|---|---|---|---|---|---|---|
| $Bi_2O_3$ | 75.1 | 82.7 |  |  | 78.1 | 94.8 | 73.3 | 73.7 |
| PbO | 10.9 | 1.83 | 43.6 | 0.7 |  |  |  |  |
| $B_2O_3$ | 1.2 | 1.34 | 4.8 | 26.7 |  |  |  |  |
| $SiO_2$ | 9.3 | 10.3 | 37.5 | 21.7 | 8.6 | 5.2 | 4.7 | 4.8 |
| CaO | 2.4 | 2.68 | 9.7 | 4.0 |  |  |  |  |
| BaO |  |  |  | 0.9 |  |  |  |  |
| ZnO |  |  |  | 27.6 | 3.9 |  |  | 5.0 |
| CuO |  |  |  |  | 7.6 |  | 5.5 |  |
| CoO |  |  |  |  | 1.8 |  |  |  |
| $Al_2O_3$ | 1.1 | 1.22 | 4.3 | 5.7 |  |  |  |  |
| $Na_2O$ |  |  |  | 8.7 |  |  |  |  |
| $ZrO_2$ |  |  |  | 4.0 |  |  |  |  |
| $GeO_2$ |  |  |  |  |  |  | 16.5 | 16.6 |

The glass binders are prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. In this work, the peak temperature is in the range 1100°–1500° C., usually 1200°–1400° C. The melt is then quenched by cooling the melt, typically by pouring onto a cold belt or into cold running water. Particle size reduction can then be accomplished by milling as desired.

Other transition metal oxides may also be employed as part of the inorganic binder, as is well known to those skilled in the art. Oxides or oxide precursors of zinc, cobalt, copper, nickel, manganese, and iron are common. These additions are known to improve conductor soldered adhesion.

The inorganic binder can also contain up to approximately 4 parts by weight basis paste of a pyrochlore-related oxide having the general formula $$(M_xM'_{2-x})M''_2O_{7-z}$$

wherein

M is selected from at least one of Pb, Bi, Cd, Cu, Ir, Ag, Y, rare earth metals having atomic numbers of 57–71 and mixtures thereof, M' is selected from Pb, Bi, and mixtures thereof, M" is selected from Ru, Ir, Rh and mixtures thereof, x=0–0.5, and z=0–1.

Pyrochlore materials have been described in detail in R. J. Bouchard, U.S. Pat. No. 3,583,931 issued Jun. 8, 1971 incorporated herein by reference. The pyrochlore materials act as adhesion promoters for the compositions of this invention. Copper bismuth ruthenate, $Cu_{0.5}Bi_{1.5}Ru_2O_{6.75}$, is preferred.

Additive

A crystalline material from the feldspar family is added to the composition described hereinabove. As defined herein, a crystalline material is defined as one that has an orderly periodic array of atoms, and gives rise to distinct diffraction peaks when subjected to X-rays. This situation contrasts with glasses in general that have a disordered arrangement, with no long term ordering of the atoms and diffuse X-ray diffraction patterns.

The additive may be selected from a range of compositions of the type $[M_a^{1+}]_x[M_b^{2+}]_{1-x}Al_{2-x}Si_{2+x}O_8$, where $M_a$ typically can be potassium (K) or sodium (Na), and $M_b$ typically is calcium (Ca) and x is 0–1. Such materials are familiar to the ceramics industry, and are additionally described in W. D. Kinergy, et al., *Introduction to Ceramics, Second Ed.*, John Wiley & Sons, N.Y., 1976. Similarly, it is believed that trivalent ions ($M_c$) such as bismuth, can be substituted for divalent calcium by charge compensating with Al/Si, e.g., $[M_c^{3+}]_x[M_b^{2+}]_{1-x}Al_{2+x}Si_{2-x}O_8$.

In addition to these anorthite-structural derivatives, other Ca-Al-Si-O phases exist, such as gehlenite, $Ca_2Al_2SiO_7$. Gehlenite also has a wide range of substitutional capability, e.g., $[M_d]_2[M_e][M_f]_2O_7$ wherein Md is selected from the group Ca,Na and Me is selected from the group Mg,Al and $M_f$ is selected from the group Si,Al.

Furthermore, the crystalline structure additive belongs to the feldspar family, which has a wide range of possible substitutions. For instance, similar benefits for aged adhesion are anticipated if a potash feldspar (microcline or orthoclase) $K(AlSi_3)O_8$ is used instead of a lime feldspar (anorthite) in the present invention. Similarly, it is expected that the soda feldspar (albite) $Na(AlSi_3)O_8$ could be used instead of a lime feldspar with a similar beneficial effect on conductor adhesion.

The preferred compositions of the present invention contain 0.01 to 3 percent by weight basis paste of cystalline anorthite of the formula, $CaAl_2Si_2O_8$.

The presence of an anorthite additive unexpectedly was found to impart higher conductor aged adhesion, with little loss in solderability. At levels below 0.01% wt., the benefits to adhesion is no longer expected, while at levels above 3% wt., the degradation to solderability is expected to be undesirable. A range of 0.05–0.50% wt. is preferred, while 0.1–0.3% wt. is most preferred.

Organic Medium

The inorganic particles are mixed with an essentially inert liquid medium (vehicle) by mechanical mixing using a planetary mixer, then dispersed on a three roll mill to form a paste-like composition having suitable consistency and rheology for screen printing. The latter is printed as a "thick film" on conventional ceramic substrates in the conventional manner.

Any essentially inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionate, terpenes such as pine oil, terpineol and the like, solutions of resins such as the polymethacrylates of lower alcohols and solutions of ethyl cellulose in solvents such as pine oil and the monobutyl ether of ethylene glycol monoacetate. A preferred vehicle is based on ethyl cellulose resin and a solvent mixture of alpha-, beta-, and gamma terpineols (generally 85–92% alpha-terpineol containing 8–15% beta- and gamma-terpineols). The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage, the dispersions will contain complementarily 60–90% solids and 40–10% vehicle, as described above. The compositions of the present invention may, of course, be modified by the addition of other materials which do not affect its beneficial characteristics. Such formulations is well within the skill of the art.

The pastes are conveniently prepared on a three-roll mill. The viscosity of the pastes is typically within the following ranges when measured on a Brookfield HBT viscometer at low, moderate and high shear rates:

| Shear Rate (sec⁻¹) | Viscosity (Pa · s) | |
| --- | --- | --- |
| 0.2 | 100–5000 | |
| | 300–2000 | Preferred |
| | 600–1500 | Most Preferred |
| 4 | 40–400 | |
| | 100–250 | Preferred |
| | 140–200 | Most Preferred |
| 40 | 10–150 | |
| | 25–120 | Preferred |
| | 50–100 | Most preferred |

The amount of vehicle utilized is determined by the final desired formulation viscosity.

Formulation and Application

In the preparation of the compositions of the present invention, the particulate inorganic solids are mixed with the organic medium and dispersed with suitable equipment, such as a three-roll mill, to form a suspension, resulting in a composition for which the viscosity will be in the range of about 100–200 pascal-seconds at a shear rate of 4 sec$^{-1}$.

In the examples which follow, the formulation was carried out in the following manner:

The ingredients of the paste are weighed together in a container. The components are then vigorously mixed to form a uniform blend; then the blend is passed through dispersing equipment, such as a three-roll mill, to achieve a good dispersion of particles. A Hegman gauge is used to determine the state of dispersion of the particles in the paste. This instrument consists of a channel in a block of steel that is 25 μm deep (1 mil) on one end and ramps up to zero depth at the other end. A blade is used to draw down paste along the length of the channel. Scratches appear in the channel where the agglomerates' diameter is greater than the channel depth. A satisfactory dispersion will give a fourth scratch point of 10–18 μm typically. The point at which half of the channel is uncovered with a well dispersed paste is between 3 and 8 μm typically. Fourth scratch measurement of >20 μm and "half-channel" measurements of >10 μm indicate a poorly dispersed suspension.

The compositions are then applied to a substrate, such as alumina ceramic, usually by the process of screen printing, to a wet thickness of about 30–80 microns, preferably 35–70 microns, and most preferably 40–50 microns. The compositions of this invention can be printed onto the substrates either by using an automatic printer or a hand printer in the conventional manner, preferably automatic screen printing techniques are employed using a 200- to 325-mesh screen. The printed pattern is then dried at below 200° C., about 150° C., for about 5–15 minutes before firing. Firing to effect sintering of both the inorganic binder and the finely divided particles of metal is preferably done in a well ventilated belt conveyor furnace with a temperature profile that will allow burnout of the organic matter at about 300°–600° C., followed by a period of maximum temperature of about 800°–1000° C. lasting about 5–15 minutes, followed by a controlled cooldown cycle to prevent over sintering, unwanted chemical reactions at intermediate temperatures or substrate fracture which can occur from too rapid cooldown. The overall firing procedure will preferably extend over a period of about 30–60 minutes, with 10–25 minutes to reach the firing temperature, about 10 minutes at the firing temperature and about 10–25 minutes in cooldown. In some instances, total cycle times can be used as short as 20–30 minutes by conventional firing and 7–14 minutes of infrared firing.

Test Procedure

Solderability: The solderability tests were performed as follows: The solder alloy employed was 62 Sn/36 Pb/2 Ag, maintained at 220° C. The fired parts were dipped in a mildly active rosin flux such as Alpha 611 (Alpha 611 is a tradename for solder flux made by Alpha Metals Inc., Jersey City, N.J.), then heated for 3 seconds by dipping the edge of the ceramic chip in the molten solder. The chip was then submerged in the solder for 5 seconds, withdrawn, cleaned and inspected. Solderability was determined by the percentage of solder coverage (buildup) obtained on the thick film test pattern. A solderability value of 95% or greater is usually considered excellent wetting.

An alternate method employed the spread of a small solder preform. Here, 1 cm squares of conductor were printed and fired, then a thin stripe of the above mentioned flux was applied across the squares with a fine brush. Solder preforms of approximately 1.4 mm diameter and 0.4 mm height were placed upon the wet flux, and parts were placed onto a Browne Corporation model LR-6 belt reflow unit to effect solder reflow. The peak reflow temperature was typically 220°–230° C. for 10–20 seconds. Alternately, if a reflow unit were not available, the substrates could instead have been placed onto a hot plate to effect reflow of the preforms. The diameter of the reflowed preforms were then measured, and the percent increase relative to the preform starting diameter is reported to assess the wettability of the conductor composition. More highly wetted materials have a greater amount of preform spread after reflowo A value of 25% increase in diameter or higher is usually considered excellent wetting.

Adhesion: The adhesion was measured using an Instron Model 1122 pull tester in a 90° C. peel configuration at a pull rate of 2 inches per minute. Twenty gauge pre-tinned wires were attached to 80 mil×80 mil pads by solder dipping for 10 seconds in 62Sn/36Pb/2Ag solder at 220° C. or in 63Sn/37Pb solder at 230° C., using Alpha 611 flux. Aging studies were carried out in air in a Blue M Stabil-Therm® oven controlled at 150° C. or 170° C. After aging, test parts were allowed to equilibrate several hours in air before the wires were pulled. A peel force of at least 15 newtons, and preferably over 18 newtons, after 48 or more hours aging at 150° C. is considered to be essential for most applications.

The wire peel adhesion of soldered thick film conductors to ceramic substrates is further described in Bulletin No. A-74672, E. I. du Pont de Nemours and Company, "Method of Test for Wire Peel Adhesion of Soldered Thick Film Conductors to Ceramic Substrates".

EXAMPLES

In the following examples, conductor pastes were printed on Hoechst Ceramtec 96% alumina substrates, unless otherwise noted. Fired thicknesses were approximately 8 to 12 microns. Aged adhesion parts were fired 5 times through a belt furnace with a peak temperature of 850° C., 10 minutes at peak temperature, and 10 mins heating and cooling from 100° C. to 850° C. The total door-to-door transit time in the furnace was approximately 48 minutes. Solderability parts were fired 1 time through the same profile.

Examples 1–6 demonstrate the essence of the invention. Conductor formulations were prepared with and without anorthite, and exhibited remarkably improved aged adhesion with 0.2% anorthite, with little degradation in solderability as measured by solder reflow diameter. This level of improved aged adhesion is very difficult to achieve by conventional means, i.e., by additions of additional frit or transition metal oxide adhesion promoters that are well known to those skilled in the art. Furthermore, the beneficial effect was observed with two different bismuthate frits, as well as with a lead borosilicate frit with added bismuth oxide.

TABLE 2

| | Example Nos. | | | | | |
|---|---|---|---|---|---|---|
| | 1 | 2 | 3 | 4 | 5 | 6 |
| Ag | 53.8 | 53.7 | 56.8 | 56.5 | 56.8 | 56.5 |
| Pd | 13.8 | 13.8 | 14.6 | 14.5 | 14.6 | 14.5 |
| Frit type | C | C | A | A | B | B |
| Frit | 1.7 | 1.7 | 5.5 | 5.7 | 5.5 | 5.7 |
| $Bi_2O_3$ | 4.0 | 4.0 | — | — | — | — |
| Pyrochlore | 4.0 | 4.0 | 2.1 | 2.1 | 2.1 | 2.1 |
| $Cu_2O$ | 1.5 | 1.5 | 1.1 | 1.1 | 1.1 | 1.1 |

TABLE 2-continued

|  | Example Nos. | | | | | |
| --- | --- | --- | --- | --- | --- | --- |
|  | 1 | 2 | 3 | 4 | 5 | 6 |
| Co₃O₄ | 0.3 | 0.3 | 0.3 | 0.3 | 0.3 | 0.3 |
| Anorthite | — | 0.2 | — | 0.2 | — | 0.2 |
| Vehicle | 20.8 | 20.7 | 19.6 | 19.5 | 19.6 | 19.5 |
| Aging Conditions (°C.) | 170, 48h | 70, 48h | 150, 100h | 150, 100h | 150, 100h | 150, 100h |
| Aged Adhesion [N] | 14.2 | 22.8 | 16.4 | 20.6 | 13.8 | 19.3 |
| Solderability [Increase in spread] | 34% | 31% | 36% | 36% | 30% | 30% |

The lower limit of effectiveness of anorthite additions was explored in Examples 7 through 12. Solderability was not measured on all samples in this set, but based on the excellent wetting of the high anorthite version in example 12 (29% increase in solder preform diameter), it is believed that all samples had excellent wetting. Higher frit levels were employed in Examples 7–12 vs. Examples 5 and 6, so that adhesion levels were somewhat higher. However, the effect of anorthite additions is still clear, and adhesion improvements were noted even at a level of 0.02% anorthite, basis paste. It is expected that below the level of 0.01% basis paste, the beneficial effects of anorthite on aged adhesion become negligible.

TABLE 3

|  | Example Nos. | | | | | |
| --- | --- | --- | --- | --- | --- | --- |
|  | 7 | 8 | 9 | 10 | 11 | 12 |
| Ag | 56.1 | 56.1 | 56.1 | 56.1 | 56.1 | 56.1 |
| Pd | 14.4 | 14.4 | 14.4 | 14.4 | 14.4 | 14.4 |
| Frit type | B | B | B | B | B | B |
| Frit | 6.73 | 6.71 | 6.68 | 6.62 | 6.57 | 6.52 |
| Pyrochlore | 2.10 | 2.10 | 2.10 | 2.10 | 2.10 | 2.10 |
| Cu₂O | 1.05 | 1.05 | 1.05 | 1.05 | 1.05 | 1.05 |
| Co₃O₄ | 0.32 | 0.32 | 0.32 | 0.32 | 0.32 | 0.32 |
| Anorthite | 0 | 0.02 | 0.05 | 0.11 | 0.16 | 0.21 |
| Vehicle | 19.4 | 19.3 | 19.3 | 19.3 | 19.3 | 19.3 |
| Aging Conditions (°C.) | 120h, 150 | 120h, 150 | 120h, 150 | 120h, 150 | 120h, 150 | 120h, 150 |
| Aged Adhesion [N] | 21.3 | 25.2 | 25.2 | 27.7 | 28.5 | 28.4 |
| Solderability [Increase in spread] | — | — | — | — | — | 29% |

Examples 1–12 all employed cobalt oxide as part of the formulation. However, the present invention does not require the presence of cobalt oxide, as demonstrated in Examples 13–16. It has previously been disclosed that cobalt oxide has a beneficial effect on aged adhesion, though cobalt oxide can degrade solderability at the levels necessary to achieve improved adhesion. Thus, the current invention allows for improved adhesion without the solderability degradation associated with cobalt oxide.

TABLE 4

|  | Example Nos. | | | |
| --- | --- | --- | --- | --- |
|  | 13 | 14 | 15 | 16 |
| Ag | 56.5 | 56.5 | 56.5 | 56.5 |
| Pd | 14.5 | 14.5 | 14.5 | 14.5 |
| Frit type | B | B | A | A |
| Frit | 6.0 | 6.0 | 6.0 | 6.0 |
| Pyrochlore | 2.0 | 2.0 | 2.0 | 2.0 |

TABLE 4-continued

|  | Example Nos. | | | |
| --- | --- | --- | --- | --- |
|  | 13 | 14 | 15 | 16 |
| Cu₂O | 1.0 | 1.0 | 1.0 | 1.0 |
| Co₃O₄ | — | — | — | — |
| Anorthite | — | 0.2 | — | 0.2 |
| Vehicle | 19.8 | 19.8 | 19.8 | 19.8 |
| Aging Conditions (°C.) | 120h, 150 | 120h, 150 | 120h, 150 | 120h, 150 |
| Aged Adhesion [N] | 14.6 | 20.8 | 11.7 | 15.4 |
| Solderability [Increase in spread] | 39% | 34% | 35% | 36% |

Examples 1–16 all employed a similar palladium content of around 14.5%, with a Ag/Pd ratio of about 3.9/1. A wide range of alloy contents are possible with the present invention, as demonstrated in Examples 17–28. For instance, 0.5% anorthite showed an increase in aged adhesion of just over 12N for a paste formulation that employed 20% Pd (Ex. 17 and 18). An increase of 11N was found from 0.25% anorthite additions to a silver paste formulation that employed 7% platinum (Ex. 19 and 20). A ternary Ag/Pd/Pt paste with 16% Pd and 4% Pt is disclosed in Ex. 21 and 22 where a nearly 12N benefit from 1% anorthite was demonstrated. Similarly, a ternary Ag/Pd/Pt with just 3.5% Pd and 1% Pt is shown in Ex. 23 and 24 where 0.2% anorthite improved aged adhesion from 16.7 to 21.3N. In Ex. 25 and 26, a low binder, Ag/Pt composition of this invention with just 0.4% Pt exhibited a more modest adhesion improvement from 0.2% anorthite. Examples 27 and 28 show compositions with 18% Pt.

The reduced adhesion benefit from anorthite additions to the Pt/Ag paste in Example 25 and 26 was probably due to the low level of inorganic binder present in the starting composition, 1% total basis paste. Thus, from the experimentation it appears that anorthite by itself will not practically lead to adhesion improvements, but needs to be used along with an inorganic binder; 1% inorganic binder represents a practical lower limit where anorthite additions have a beneficial effect. On the other hand, anorthite can beneficially be used in conductor systems that have a level of inorganic binder as high as 18%, as shown in Examples 21 and 22, though the solderability of conductors that have more than about 18% binder will likely be degraded, as evidenced by solderabililty values around 90–93% in Examples 21 and 22.

The beneficial effects of anorthite additions have been demonstrated in so-called glass bonded, oxide bonded, and mixed bonded systems. A glass bonded system employs just glass frit as the inorganic binder, as seen in Examples 17 and 18 and Examples 21 and 22 (of course, the presence of anorthite pastes 18 and 22 technically disqualify them from being called glass bonded systems, but the term "glass bonded" is used to describe the starting paste formulations). The glass bonded systems in the Examples of the present invention have all employed a single frit, though mixtures of glass frits can also be employed, as is obvious to those skilled in the art. The Examples 25 and 26 demonstrate the benefit of anorthite addition to an oxide bonded system, while Examples 1–16 show the beneficial effects of anorthite in mixed bonded systems. Again, the mixed bonded systems have also employed a single frit, though mixtures of frits can also be employed, as is obvious to those skilled in the art.

The high limit of anorthite addition is defined by where the degradation in solderability is too great to tolerate. To some extent, this limit depends on alloy content since high Pd content conductors require higher frit levels to develop bonding, and so tolerate higher levels of paste additives, as is well known to those skilled in the art. Anorthite levels of 0.5% and 1.0% were used in Examples 18 and 22, respectively, with little change in the solderability of their starting compositions. It is believed that anorthite levels above about 3% will lead to solderability degradations in all systems of practical interest. However, in applications where solderability has little or no value, or where other means are used to achieve interconnection, it would be possible to use anorthite levels above 3%.

Several other conductor glass systems were evaluated to determine the versatility of anorthite additives in thick film conductor formulations, as described in Examples 30–39. For instance, a complex zinc borosilicate (glass D) was employed in a Ag/Pd/Pt conductor formulation, shown in Examples 30 and 31. Here, cobalt oxide was replaced with anorthite, with improved adhesion performance. Also, a series of lead-free glasses were evaluated in Examples 32–39. The particular formulations that were evaluated did

TABLE 5

| | Example Nos. | | | | | | | | | | | |
|---|---|---|---|---|---|---|---|---|---|---|---|---|
| | 17 | 18 | 19 | 20 | 21 | 22 | 23 | 24 | 25 | 26 | 27 | 28 |
| Ag | 47.0 | 47.0 | 56.0 | 56.0 | 44.0 | 44.0 | 70.0 | 70.0 | 83.3 | 83.3 | 54.0 | 54.0 |
| Pd | 20.0 | 20.0 | — | — | 16.0 | 16.0 | 3.5 | 3.5 | — | — | — | — |
| Pt | — | — | 7.0 | 7.0 | 4.0 | 4.0 | 1.0 | 1.0 | 0.4 | 0.4 | 18.0 | 18.0 |
| Frit type | A | A | A | A | A | A | C | C | — | — | C | C |
| Frit | 15.0 | 15.0 | 12.0 | 12.0 | 18.0 | 18.0 | 1.5 | 1.5 | — | — | 2.06 | 2.06 |
| $Bi_2O_3$ | — | — | — | — | — | — | 1.0 | 1.0 | 0.45 | 0.45 | 4.94 | 4.94 |
| PbO | — | — | — | — | — | — | — | — | 0.15 | 0.15 | — | — |
| Pyrochlore | — | — | 2.0 | 2.0 | — | — | 3.5 | 3.5 | — | — | — | — |
| $Cu_2O$ | — | — | — | — | — | — | 0.15 | 0.15 | 0.23 | 0.23 | 0.3 | 0.3 |
| ZnO | — | — | — | — | — | — | — | — | 0.17 | 0.17 | — | — |
| $Co_3O_4$ | — | — | — | — | — | — | 0.5 | 0.5 | — | — | — | — |
| Anorthite | — | 0.5 | — | 0.25 | — | 1.0 | — | 0.2 | — | 0.2 | — | 0.2 |
| Vehicle | 18.0 | 18.0 | 23.0 | 23.0 | 18.0 | 18.0 | 18.85 | 18.85 | 15.3 | 15.3 | 20.7 | 20.7 |
| Aging Conditions (°C.) | 48h, 150 | 48h, 150 | 48h, 150 | 48h, 150 | 48h, 150 | 48h, 150 | 48h, 150 | 48h, 150 | 48h, 170 | 48h, 170 | 48h, 170 | 48h, 170 |
| Aged Adhesion [N] | 7.2 | 19.3 | 18.5 | 29.6 | 13.1 | 24.9 | 16.7 | 21.3 | 10.4 | 12.2 | 16.1 | 20.9 |
| Solderability [percent] | 99% | 99% | 99% | 96% | 93% | 90% | 100% | 100% | 96% | 98% | 99% | 100% |

The present invention is not limited to silver-based conductor formulations. A Au/Pt/Pd composition is shown in Example 29 that demonstrated high adhesion and solderability with the use of 0.2% anorthite. To obtain high aged adhesion without the use of anorthite in this system would require considerably higher levels of inorganic binder, which would degrade solderability. The solder used was 63/37 Sn/Pb, at a temperature of 240° C. The paste was printed over Coor Ceramics (Golden Colorado) 96% alumina substrates, and fired 6×.

TABLE 6

| Example No. | 29 |
|---|---|
| Au | 56.5 |
| Pd | 2.58 |
| Pt | 15.2 |
| Frit type | C |
| Frit | 2.2 |
| $Bi_2O_3$ | 4.6 |
| $Co_3O_4$ | 0.35 |
| Anorthite | 0.20 |
| Vehicle | 19.8 |
| Aging Conditions (°C.) | 300h, 150 |
| Aged Adhesion [N] Alumina | >25N |
| Aged Adhesion [N] 5704 dielectric | >25N |
| Solderability [percent] Alumina | 99% |
| Solderability [percent] 5704 dielectric | 100% | not have high aged adhesion—all values in Examples 32–39 were below 18N—but 0.2% anorthite improved adhesion in these cases by 3.1 to 5.6N. Higher glass frit levels, or additions of other transition metal oxides such as cobalt oxide or nickel oxide, would likely have improved adhesion further in these examples.

Examples 40–42 are included for comparison and to demonstrate that an amorphous calcium aluminosilicate glass cannot be used in place of anorthite in the present invention. The composition in weight % of the Ca-Al-Si glass was as follows: 24.0% CaO, 14.6% $Al_2O_3$, 61.4% $SiO_2$. Here, no change in aged adhesion was observed when 0.2% of this Ca-Al-Si glass was added to the starting composition, as opposed to when 0.2% crystalline anorthite was added. (Note that Examples 40 and 42 are essentially remakes of Examples 13 and 14, respectively, though with different batches of powders. The differences in test data between them can be accounted for by minor processing variations such as degree of agglomeration of the metal particles in the final paste, the extent of densification of the conductors, etc.)

TABLE 7

| | Example Nos. | | | | | | | | | |
|---|---|---|---|---|---|---|---|---|---|---|
| | 30 | 31 | 32 | 33 | 34 | 35 | 36 | 37 | 38 | 39 |
| Ag | 47.0 | 47.0 | 56.5 | 56.5 | 56.5 | 56.5 | 56.5 | 56.5 | 56.5 | 56.5 |
| Pd | 16.0 | 16.0 | 14.5 | 14.5 | 14.5 | 14.5 | 14.5 | 14.5 | 14.5 | 14.5 |
| Pt | 1.0 | 1.0 | — | — | — | — | — | — | — | — |
| Frit type | D | D | E | E | F | F | G | G | H | H |
| Frit | 3.0 | 3.0 | 6.0 | 6.0 | 6.0 | 6.0 | 6.0 | 6.0 | 6.0 | 6.0 |
| $Bi_2O_3$ | 9.0 | 9.0 | — | — | — | — | — | — | — | — |
| Pyrochlore | 0.75 | 0.75 | 2.0 | 2.0 | 2.0 | 2.0 | 2.0 | 2.0 | 2.0 | 2.0 |
| $Cu_2O$ | — | — | 1.0 | 1.0 | 1.0 | 1.0 | 1.0 | 1.0 | 1.0 | 1.0 |
| $Co_3O_4$ | 0.25 | — | — | — | — | — | — | — | — | — |
| Anorthite | — | 0.25 | — | 0.2 | — | 0.2 | — | 0.2 | — | 0.2 |
| Vehicle | 23.0 | 23.0 | 19.8 | 19.8 | 19.8 | 19.8 | 19.8 | 19.8 | 19.8 | 19.8 |
| Aging Conditions (°C.) | 48h, 150 | 48h, 150 | 48h, 150 | 48h, 150 | 48h, 150 | 48h, 150 | 48h, 150 | 48h, 150 | 48h, 150 | 48h, 150 |
| Aged Adhesion [N] | 20 | 28 | 12.4 | 16.2 | 6.4 | 11.8 | 4.7 | 7.8 | 9.7 | 15.3 |
| Solderability [percent] | 100% | 100% | 100% | 100% | 100% | 100% | 59% | 63% | 62% | 60% |

TABLE 8

| | Example Nos. | | |
|---|---|---|---|
| | 40 | 41 | 42 |
| Ag | 56.5 | 56.5 | 56.5 |
| Pd | 14.5 | 14.5 | 14.5 |
| Frit type | B | B | B |
| Frit | 6.0 | 6.0 | 6.0 |
| Pyrochlore | 2.0 | 2.0 | 2.0 |
| $Cu_2O$ | 1.0 | 1.0 | 1.0 |
| Ca—Al—Si glass | — | 0.2 | — |
| Anorthite | — | — | 0.2 |
| Vehicle | 19.8 | 19.8 | 19.8 |
| Aging Conditions (°C.) | 48h, 150 | 48h, 150 | 48h, 150 |
| Aged Adhesion [N] | 5.4 | 5.0 | 12.6 |
| Solderability [percent] | 100% | 99% | 100% |

What is claimed is:

1. A thick film composition consisting of by weight, basis paste: (A) 50 to 90% wt. of finely divided particles of metallic conductive phase; (B) 1 to 18% wt. of an inorganic binder phase with at least one glass, metal oxide, metal oxide precursor, pyrochlore-related compound, or pyrochlore-related compound precursor, wherein the metal is copper, cobalt, lead, bismuth, zinc, nickel, manganese, or iron; (C) 0.01 to 3.0% wt. adhesion promoter of a formula selected from the group consisting of $[M_a^{1+}]_x[M_b^{2+}]_{1-x}Al_{2-x}Si_{2+x}O_8$, $[M_c^{3+}]_x[M_b^{2+}]_{1-x}Al_{2+x}Si_{2-x}O_8$, and $[M_d]_2[M_e][M_f]_2O_7$; wherein $M_a$ is K or Na, $M_b$ is Ca, $M_c$ is Bi, Fe, Mn, Cr, V, Sc, In, Y, Gd, Eu, Sm, Nd, Pr, Ce, La, or Sb, $M_d$ is Ca or Na, $M_e$ is Mg or Al, $M_f$ is Si or Al, and x is 0–1; and (D) an organic medium as the balance; wherein all of (A), (B), and (C) are dispersed in (D).

2. The composition of claim 1 wherein the glass is selected from the group consisting of bismuthate frit, lead silicate frit, lead borosilicate frit, or mixtures thereof, and the metal oxide, metal oxide precursor, pyrochlore-related compound, or pyrochlore-related compound precursor is 0 to 3% wt. copper oxide, 0 to 4% wt. of a pyrochlore-related compound, 0 to 1% wt. cobalt oxide, 0 to 5% wt. lead oxide, and 0 to 12% wt. bismuth oxide, or precursors thereof, basis paste.

3. The composition of claim 2 wherein the pyrochlore-related compound corresponds to the formula $(M_xM'_{2-x})M''_2O_{7-z}$, wherein M is selected from Pb, Bi, Cd, Cu, Ir, Ag, Y, rare earth metals having atomic numbers of 57–71 and mixtures thereof, M' is selected from Pb, Bi, and mixtures thereof, M" is selected from Ru, Ir, Rh and mixtures thereof, and x=0–0.5, and z=0–1.

4. The composition of claim 1 wherein the adhesion promoter is $CaAl_2Si_2O_8$.

5. The composition of claim 1 wherein the conductive phase is selected from Ag, Ag and Pd, Ag and Pt, or Ag and Pd and Pt, wherein the Pd content is 0 to 20% wt., and the Pt content is 0 to 20% wt.

6. The composition of claim 1 wherein the conductive phase is selected from Au, Au and Pd, Au and Pt, or Au and Pd and Pt, wherein the Pd content is 0 to 20% wt., and the Pt content is 0 to 20% wt.

7. The composition of claim 1 wherein the inorganic binder is one or more glasses.

8. The composition of claim 3 wherein the pyrochlore-related compound is $Cu_{0.5}Bi_{1.5}Ru_2O_{6.75}$.

9. The composition of claim 1 wherein the inorganic binder is one or more metal oxide, metal oxide precursor, pyrochlore-related compound, or pyrochlore-related compound precursor.

* * * * *